United States Patent
Chen et al.

(10) Patent No.: US 11,817,452 B2
(45) Date of Patent: Nov. 14, 2023

(54) METHOD FOR FORMING DECOUPLING CAPACITORS BETWEEN THE INTERPOSING CONDUCTORS AND THE MULTIPLE GATES

(71) Applicant: TAIWAN SEMICONDUCTOR MANUFACTURING CO., LTD., Hsinchu (TW)

(72) Inventors: Chung-Hui Chen, Hsinchu (TW); Hao-Chieh Chan, Hsinchu (TW); Wei-Chih Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 132 days.

(21) Appl. No.: 17/227,199

(22) Filed: Apr. 9, 2021

(65) Prior Publication Data
US 2021/0233904 A1    Jul. 29, 2021

Related U.S. Application Data

(62) Division of application No. 16/723,938, filed on Dec. 20, 2019, now Pat. No. 10,978,449, which is a division of application No. 16/138,785, filed on Sep. 21, 2018, now Pat. No. 10,515,947, which is a division of application No. 15/663,644, filed on Jul. 28, 2017, now Pat. No. 10,083,955, which is a division of application No. 15/055,562, filed on Feb. 27, 2016, now Pat. No. 9,748,226.

(51) Int. Cl.
| | |
|---|---|
| *H01L 29/94* | (2006.01) |
| *H01L 27/06* | (2006.01) |
| *H01L 49/02* | (2006.01) |
| *H01L 27/02* | (2006.01) |
| *H01L 23/522* | (2006.01) |
| *H01L 23/528* | (2006.01) |

(52) U.S. Cl.
CPC ........ *H01L 27/0629* (2013.01); *H01L 23/528* (2013.01); *H01L 23/5223* (2013.01); *H01L 27/0207* (2013.01); *H01L 28/40* (2013.01)

(58) Field of Classification Search
CPC ............. H01L 27/0629; H01L 23/5223; H01L 23/528; H01L 27/0207
USPC .................................................. 257/300
See application file for complete search history.

(56) References Cited

U.S. PATENT DOCUMENTS

| | | |
|---|---|---|
| 8,120,086 B2 | 2/2012 | Law et al. |
| 9,012,270 B2 | 4/2015 | Xu et al. |
| 9,153,642 B2 | 10/2015 | Li et al. |
| 9,564,428 B1 | 2/2017 | Basker et al. |

(Continued)

FOREIGN PATENT DOCUMENTS

| | | |
|---|---|---|
| CN | 101714551 A | 5/2010 |
| CN | 102655147 A | 9/2012 |

(Continued)

*Primary Examiner* — Phuc T Dang
(74) *Attorney, Agent, or Firm* — Maschoff Brennan

(57) ABSTRACT

A method disclosed includes the following operations as below: forming at least one capacitor between multiple interposing conductors and multiple gates; and forming multiple interposing connectors connected to the interposing conductors. One of the interposing conductors is interposed between two adjacent gates of the gates. In a plain view, the interposing connectors are separate from the gates.

20 Claims, 7 Drawing Sheets

(56) References Cited

U.S. PATENT DOCUMENTS

| | | |
|---|---|---|
| 2003/0033579 A1 | 2/2003 | Wu et al. |
| 2003/0141811 A1 | 7/2003 | Park et al. |
| 2004/0159894 A1 | 8/2004 | Blisson et al. |
| 2005/0044522 A1 | 2/2005 | Maeda |
| 2009/0135125 A1 | 5/2009 | Park |
| 2013/0181269 A1 | 7/2013 | Chen |
| 2014/0061744 A1 | 3/2014 | Zhang et al. |
| 2015/0325514 A1 | 11/2015 | Mojumder et al. |
| 2016/0035808 A1 | 2/2016 | Jung et al. |
| 2016/0133742 A1 | 5/2016 | Okuda et al. |
| 2016/0163694 A1* | 6/2016 | Baek .................. H01L 27/0922 257/300 |
| 2016/0197071 A1* | 7/2016 | Yeh ...................... H01L 23/485 438/396 |
| 2016/0329276 A1 | 11/2016 | Lin et al. |
| 2017/0062417 A1 | 3/2017 | Chun |
| 2018/0040621 A1 | 2/2018 | Liaw |

FOREIGN PATENT DOCUMENTS

| | | |
|---|---|---|
| CN | 103199121 A | 7/2013 |
| CN | 103247678 A | 8/2013 |
| CN | 105074916 A | 11/2015 |
| CN | 105280700 A | 1/2016 |
| CN | 105762134 A | 7/2016 |
| TW | 201435631 A | 9/2014 |

* cited by examiner

METHOD FOR FORMING DECOUPLING CAPACITORS BETWEEN THE INTERPOSING CONDUCTORS AND THE MULTIPLE GATES

REFERENCE TO RELATED APPLICATION

This application is a divisional application of U.S. application Ser. No. 16/723,938, filed on Dec. 20, 2019, now U.S. Pat. No. 10,978,449, issued Apr. 13, 2021, which is a divisional application of U.S. application Ser. No. 16/138,785 filed on Sep. 21, 2018, now U.S. Pat. No. 10,515,947, issued Dec. 24, 2019, which is a divisional application of U.S. application Ser. No. 15/663,644 filed on Jul. 28, 2017, now U.S. Pat. No. 10,083,955, issued Sep. 25, 2018, which is a divisional application of U.S. application Ser. No. 15/055,562 filed on Feb. 27, 2016, now U.S. Pat. No. 9,748,226, issued Aug. 29, 2017, all of which are incorporated herein by reference.

BACKGROUND

Decoupling capacitors are widely used in various circuits. A decoupling capacitor is a capacitor configured to decouple one part of an electrical circuit from another. With the decoupling capacitor, noise caused by a post-stage circuit or a pre-stage circuit is reduced, and the interference to other circuits is prevented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
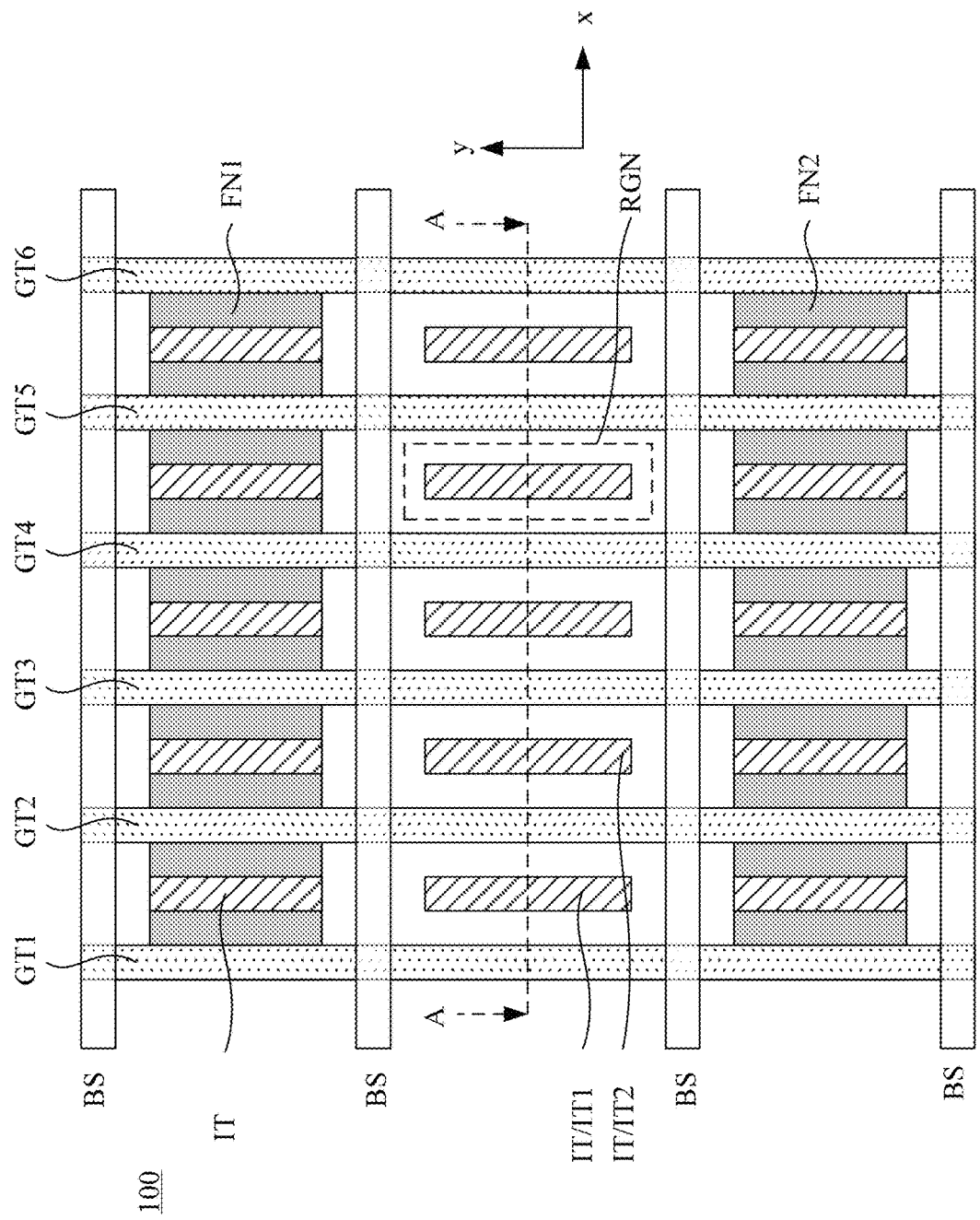
FIG. 1A is a top view of a schematic layout of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a top view of a schematic layout of a semiconductor device 100, in accordance with some embodiments of the present disclosure.

In some embodiments, semiconductor device 100 includes two active areas FN1, FN2, a plurality of gates GT1-GT6, and a plurality of conductors IT. The numbers of the active areas, the gates, and the conductors are given for illustrative purposes. Various numbers of the active areas, the gates, and the conductors are within the contemplated scope of the present disclosure.

The terms "comprise" or "comprising," "include" or "including," "have" or "having," and the like used in this application are to be understood to be open-ended, i.e., to mean including but not limited to. Accordingly, various elements and/or structures, which are not shown in FIG. 1A and formed in the semiconductor device 100, are within the contemplated scope of the present disclosure.

For illustration in FIG. 1A, the active areas FN1, FN2 are disposed in parallel to and apart from each other, and are elongated in the x direction. In some embodiments, each one of the active areas FN1, FN2 includes one or more fin structures for forming, for example, Fin Field-Effect Transistor (FinFET). In various embodiments, at least one fin structure is formed on, or formed with, each one of the active areas FN1, FN2. In some embodiments, the term "active area" discussed in the present disclosure is also referred to as "OD" (oxide dimensioned area).

In some embodiments, the gates GT2-GT5 cross over the active areas FN1, FN2 to form transistors (e.g., FinFETs). In further embodiments, the transistors are configured to implement MOS capacitors. In some embodiments, the term "gate" discussed in the present disclosure is also referred to as "PO."

In some embodiments, the active areas FN1, FN2 are formed over an insulating layer (not shown). In some embodiments, the active areas FN1, FN2 are formed by using semiconductor material. In some other embodiments, the active areas FN1, FN2 are formed by using silicon on insulator (SOI) technology. In some alternative embodiments, the active areas FN1, FN2 are patterned from an epitaxial layer of semiconductor material.

For illustration in FIG. 1A, each one of the active areas FN1, FN2 has source regions and drain regions, and one source region and one drain region are formed at two opposite sides of each one of the gates GT2-GT5. In some embodiments, the source regions and the drain regions are located at respective sides of channel regions that are formed beneath the gates GT2-GT5. In some embodiments, the source regions and the drain regions are source doped regions and drain doped regions, respectively. In some alternative embodiments, the source regions and the drain regions of the active areas FN1, FN2 are uniformly doped.

For illustration in FIG. 1A, the gates GT1-GT6 are disposed in parallel to each other and apart from each other, and are elongated in the y direction. In some embodiments, the gates GT1-GT6 are perpendicular to the active areas FN1, FN2 in a planar view. In some embodiments, the gates GT1-GT6 are formed by using polycrystalline silicon, a metal, and/or alloy, including, for example, titanium nitride, tantalum nitride, or aluminum nitride. Various material and/or alloys to form the gates GT1-GT6 are within the contemplated scope of the present disclosure. The phrase "and/or" used herein and in the application, includes any and all combinations of one or more of the associated listed items.

In some embodiments, the two active areas FN1, FN2 and the gates GT1-GT6 define a plurality of regions. For illustration, the active areas FN1, FN2 and the gates GT4, GT5 basically surround and define a rectangular region RGN. For simplicity of illustration, only one rectangular region RGN is depicted and labeled in FIG. 1A. Other regions similar to the rectangular region RGN are within the contemplated scope of the present disclosure.

In some embodiments, some of the conductors IT are separately disposed in the regions surrounded by the two active areas FN1, FN2 and the gates GT1-GT6. Explained in a different way, each of the conductors IT between the two active areas FN1, FN2 is also disposed between adjacent two of the gates GT1-GT6. For illustration, the conductor IT1 is disposed in the region surrounded by the active areas FN1, FN2 and two gates GT1, GT2, and the conductor IT2 is disposed in the region surrounded by the active areas FN1, FN2 and two gates GT2, GT3.

In some other embodiments, some of the conductors IT are disposed on the active areas FN1, FN2. In such embodiments, the conductors IT disposed on the active areas FN1, FN2 are configured to electrically connect the active areas FN1, FN2 to another layer of the semiconductor device 100.

In some embodiments, the conductors IT are formed with a conductive contact segment. For illustration, the conductors IT in FIG. 1A are disposed in parallel to and apart from each other, and have longitudinal edges in the y direction. In some embodiments, the conductors IT are disposed in parallel to the gates GT1-GT6 and apart from the gates GT1-GT6. In some embodiments, the term "conductor" or "conductive contact segment" discussed in the present disclosure is also referred to as "M0_OD."

In some embodiments, a metal line (not shown) arranged to receive an input is electrically connected to the gates GT2-GT5. For illustration, in a top-down sequence, the metal line is electrically connected through local conductive metal segments (not shown) to at least one of the gates GT2-GT5. In some embodiments, the term "local conductive metal segment" is also referred to as "M0PO."

In some embodiments, the height of the conductor IT is greater than the height of each of the gates GT1-GT6. In some other embodiments, the height of the local conductive metal segment plus the height of one of the gates GT1-GT6 is substantially equal to the height of the conductor IT.

In some embodiments, the semiconductor device 100 further includes cut lines BS. For illustration in FIG. 1A, the cut lines BS are formed in between the portions, on the active areas FN1 and FN2, of the gates GT1-GT6, to physically disconnect them. In such embodiments, the gates GT1-GT6 on the active area FN1 and/or the gates GT1-GT6 on the active area FN2 are connected with each other through the local conductive metal segment (e.g., M0PO) as discussed above or metal lines (not shown). In some embodiments, the cut lines BS are implemented in a poly cut layer (also referred to as "CPO" in some embodiments).

In alternative embodiments, the cut lines BS are not formed and are not required. In such embodiments, each one of the gates GT1-GT6 is elongated and crosses over the active areas FN1 and FN2.

For illustration in FIG. 1A, the cut lines BS are disposed in parallel to and apart from each other, and are elongated in the x direction. In some embodiments, the cut lines BS are perpendicular to the gates GT1-GT6 in a planar view. In some embodiments, two of the cut lines BS are disposed at, and spaced apart from, two sides of the active area FN1, and the other two of the cut lines BS are disposed at, and spaced apart from, two sides of the active area FN2, as illustrated in FIG. 1A. In some embodiments, as illustrated in FIG. 1A, at least one of the cut lines BS is disposed between the conductors IT that are disposed on the active area FN1 (and/or FN2), and the conductors IT that are formed in the rectangular regions RGN as described above.

The number of the cut lines BS is given for illustrative purposes. Various numbers of the cut lines BS are within the contemplated scope of the present disclosure.

Figure 1B:
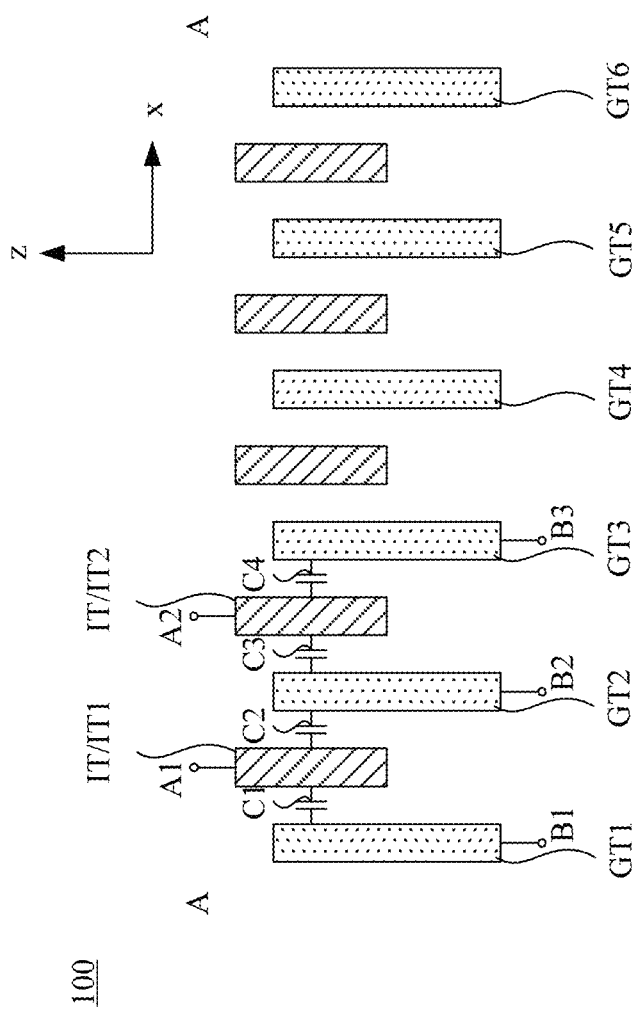
FIG. 1B is a schematic side view of components in the semiconductor device, taken along a line A-A, in FIG. 1A, in accordance with some embodiments of the present disclosure.

FIG. 1B is a schematic side view of the gates GT1-GT6 and the conductors IT in the semiconductor device 100, taken along a line A-A, in FIG. 1A, in accordance with some embodiments of the present disclosure. In some embodiments, for illustration in FIG. 1B, the gates GT1-GT6 and the conductors IT are at least partially overlapped in the z direction to form a plurality of capacitors. For illustration, the gate GT1 and the conductor IT1 are partially overlapped in the z direction to form a first capacitor C1. The conductor IT1 and the gate GT2 are partially overlapped in the z direction to form a second capacitor C2. The gate GT2 and the conductor IT2 are partially overlapped in the z direction to form a third capacitor C3. The conductor IT2 and the gate GT3 are partially overlapped in the z direction to form a fourth capacitor C4.

In some embodiments, the capacitors C1, C2, C3 and C4 are formed to be electrically connected in series. In some other embodiments, the capacitors C1, C2, C3 and C4 are formed to be electrically connected in parallel. In alternative embodiments, the capacitors C1, C2, C3 and C4 are formed to be electrically connected in series and parallel combination.

For illustration with reference to FIG. 1A and FIG. 1B, the gates GT1-GT6 and the conductors IT are also at least partially overlapped in the y direction. For simplicity of illustration, the overlaps in the y direction are not shown in the figures of the present disclosure. With reference to FIG. 1A and FIG. 1B, one of ordinary skill in the art would realize how the gates GT1-GT6 and the conductors IT are at least partially overlapped in the y direction.

The terms "first," "second," etc. used in this application is used to describe various elements, these elements should not be limited by these terms. These terms are only used to distinguish one element from another. For example, a first element could be termed a second element, and, similarly, a second element could be termed a first element, without departing from the scope of the embodiments. Accordingly, various elements and/or structures, which are not shown in FIG. 1A and formed in the semiconductor device 100, are within the contemplated scope of the present disclosure.

Figure 1C:
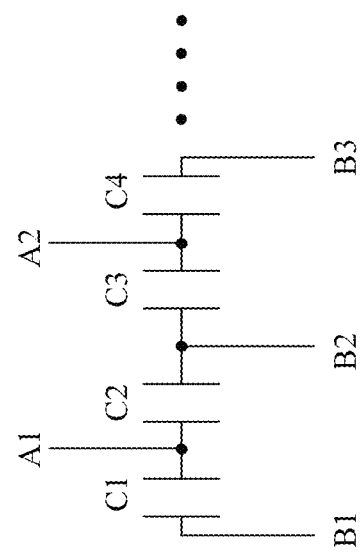
FIG. 1C is a circuit diagram of a circuit including capacitors in FIG. 1B, in accordance with some embodiments of the present disclosure.

FIG. 1C is a circuit diagram of a circuit including capacitors C1-C4 in FIG. 1B, in accordance with some embodiments of the present disclosure. For simplicity of illustration, the capacitors C1-C4 are given for illustration in FIG. 1C. Additional capacitors connected to the capacitors C1-C4 are within the contemplated scope of the present disclosure.

In some embodiments, the capacitors C1, C2, C3, C4 are electrically and/or physically connected in series. For illustration with reference to FIG. 1C, a first end of the capacitor C1 is electrically connected to a node B1. A second end of the capacitor C1 and a first end of the capacitor C2 are electrically connected to a node A1. A second end of the capacitor C2 and a first end of the capacitor C3 are electrically connected to a node B2. A second end of the capacitor C3 and a first end of the capacitor C4 are electrically connected to a node A2. A second end of the capacitor C4 is electrically connected to a node B3.

As described above with reference to FIG. 1A, the gates GT1-GT6 are electrically connected with each other through the local conductive metal segment (e.g., M0PO) or metal lines (not shown) in some embodiments. In such embodiments, the nodes B1-B3 are electrically connected with each other.

Moreover, as described above, with reference to FIG. 1B and FIG. 1C, the conductors IT are electrically connected with each other in some embodiments. In such embodiments, the nodes A1, A2 are electrically connected with each other. In such a configuration of the nodes B1-B3 connected together and the nodes A1, A2 connected together, the capacitors C1, C2, C3, C4 are electrically connected in parallel.

With reference to FIG. 1B, in some embodiments, the conductors IT are electrically connected through metal lines (not shown). In some embodiments, a power supply line for supplying power is implemented in the metal line. For illustration with reference to FIG. 1A, the metal line is elongated in the x direction and is in parallel with the cut lines BS.

In alternative embodiments, the conductors IT in FIG. 1B are electrically connected with each other through metal lines (not shown), and the gates GT1-GT6 are electrically connected with each other through the local conductive metal segment (e.g., M0PO) as discussed above or metal lines (not shown). As a result, the capacitors C1-C4 are electrically connected in parallel.

The connections and/or configurations discussed above are given for illustrative purposes. Various connections and/or configurations of the conductors IT and the gates GT1-GT6 are within the contemplated scope of the present disclosure. For example with reference to FIG. 1B, in various embodiments, the gate GT1 is electrically disconnected from the gates GT2-GT6, the gates GT2-GT6 are electrically connected with each other, and the conductors IT are electrically connected with each other. In such embodiments, the node B1 is configured to receive a voltage different from the voltage of the nodes B2 and B3, and the nodes A1, A2 are configured to receive a same voltage. Equivalently, the capacitors C2-C4 are electrically connected in parallel, and the capacitor C1 is electrically connected in series with the parallel connection of the capacitors C2-C4. Accordingly, with various connections and/or configurations of the conductors IT and the gates GT1-GT6, the capacitors C1-C4 in FIG. 1B are connected in series, in parallel, or in series and parallel combination.

With reference to FIG. 1B, in some embodiments, heights of the gates GT1-GT3 and/or the conductors IT in the z direction correspond to capacitances of the capacitors C1-C4. In some embodiments, top portions of the conductors IT are higher than top portions of the gates GT1-GT6, as illustrated in FIG. 1B. In such embodiments, when the heights of the gates GT1-GT6 are increased with respect to the conductors IT toward +z direction (i.e., upward direction in FIG. 1B), the overlaps between the gates GT1-GT6 and the conductors IT are increased accordingly. Alternatively, when the heights of the conductors IT are increased with respect to the gates GT1-GT6 toward −z direction (i.e., downward direction in FIG. 1B), the overlaps between the gates GT1-GT6 and the conductors IT are increased accordingly. With the increased overlaps between the gates GT1-GT6 and the conductors IT, the capacitances of the capacitors C1-C4 are increased accordingly.

For illustration, when both of the heights of the gate GT1 and the conductor IT1 are increased, for example, in the upward direction in FIG. 1B, the overlap between the gate GT1 and the conductor IT1 is increased, and the capacitance of the capacitor C1 is increased accordingly. For another illustration, when the heights of the gate GT2 and the conductors IT1, IT2 are increased, for example, in the upward direction in FIG. 1B, both of the overlaps between the gate GT2 and the conductors IT1, IT2 are increased, and both of the capacitances of the capacitors C2, C3 are increased accordingly.

In some embodiments, the height of at least one of the gates GT1-GT6 and the conductors IT ranges between about 20 and about 200 nanometers. In various embodiments, the heights of the gates GT1-GT6 range between about 50 and about 70 nanometers. In various embodiments, the heights of the conductors IT range between about 40 and about 60 nanometers. The heights of the gates GT1-GT6 and the conductors IT are given for illustrative purposes. Various heights of the gates GT1-GT6 and the conductors IT in various manufacturing processes are within the contemplated scope of the present disclosure.

In some embodiments, each one of spacings between the gates GT1-GT6 and the conductors IT ranges between about 1 and about 150 nanometers. The spacing of about 1 nanometer is a spacing that is able to be formed according to process limitation. The spacing of about 150 nanometers is a spacing for one gate and one conductor IT to form an effective capacitance. The spacings between the gates GT1-GT6 and the conductors IT correspond to capacitances of the capacitors discussed above. Effectively, the shorter the spacings between the gates GT1-GT6 and the conductors IT, the greater the capacitances of the capacitors. For illustration, when the spacing between the gate GT1 and the conductor IT1 is decreased, the capacitance of the capacitor C1 is increased.

In some approaches, the OD density (i.e., the area of the active areas) is limited by process. Thus, it is impossible for MOS capacitors to be disposed at the space between the active areas FN1, FN2. Therefore, the capacitance density of the semiconductor device is restricted.

Compared to the approaches above, in the present disclosure, the conductors IT are disposed on the active areas FN1, FN2 and also disposed within the regions surrounded by the gates GT1-GT6 and the active areas FN1, FN2. Accordingly, areas of the conductors IT at least partially overlap areas of the gates GT1-GT6 to form the capacitors as described above. In such a manner, the semiconductor device 100 has a high capacitance density, compared to the device in other approaches.

In addition, in the present disclosure, when the manufacturing process shrinks (e.g., from 10-nm-scale to 7-nm-scale), the heights of the gates GT1-GT6 and the conductors IT would be increased, and the spacings among the gates GT1-GT6 and the conductors IT would be decreased. Therefore, the capacitances of the capacitors formed by the gates GT1-GT6 and the conductors IT would be increased in a manner along with the improvement of the manufacturing process.

Moreover, in the present disclosure, the conductors IT are formed in the metal layer including M0_OD in some embodiments as described above, and thus it is not necessary to use additional masks to form the conductors IT and build the corresponding capacitors.

Furthermore, in the present disclosure, the pitches of the gates GT1-GT6 and the conductors IT are the same as a digital PO pitch, which is the smallest pitch in the corresponding manufacturing process. Thus, the semiconductor device 100 with a high capacitance density is able to be implemented.

Figure 2A:
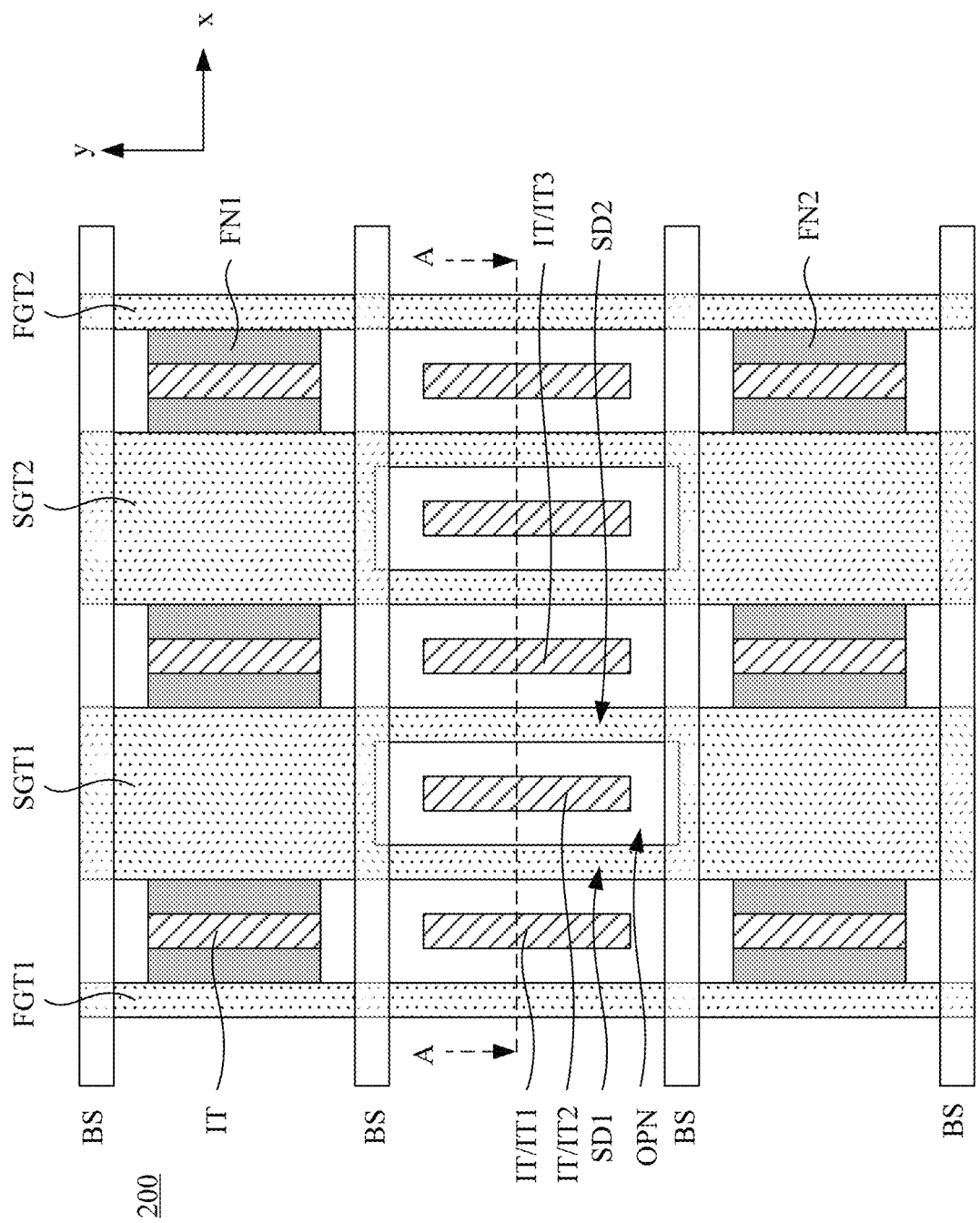
FIG. 2A is a top view of a schematic layout of a semiconductor device, in accordance with some other embodiments of the present disclosure.

FIG. 2A is a top view of a schematic layout of a semiconductor device 200, in accordance with some other embodiments of the present disclosure. With respect to the embodiments of FIG. 1A, like elements in FIG. 2A are designated with the same reference numbers for ease of understanding.

In some embodiments, a semiconductor device 200 includes two active areas FN1, FN2, a plurality of first gates FGT1, FGT2, a plurality of second gates SGT1, SGT2, and a plurality of conductors IT. The numbers of the active areas, the first gates, the second gates, and the conductors are given for illustrative purposes. Various numbers of active areas, the first gates, the second gates, and the conductors are within the contemplated scope of the present disclosure.

In some embodiments, the active areas FN1, FN2 are disposed in parallel to and apart from each other, and are elongated in the x direction. Details of the active areas FN1, FN2 can be ascertained with reference to the paragraphs described above, and a description that is repeated will not be described herein.

In some embodiments, the second gates SGT1, SGT2 cross over the active areas FN1, FN2. In some embodiments, the second gates SGT1, SGT2 cross over the active areas FN1, FN2 to form transistors (e.g., FinFETs). In some embodiments, the transistors are configured to implement MOS capacitors.

In some embodiments, the first gates FGT1, FGT2 are disposed in parallel to and apart from each other, and are elongated in the y direction. In some embodiments, the first gates FGT1, FGT2 are perpendicular to the active areas FN1, FN2 in a planar view.

In some embodiments, the second gates SGT1, SGT2 are disposed in parallel to and apart from each other, and are elongated in the y direction. In some embodiments, the second gates SGT1, SGT2 are perpendicular to the active areas FN1, FN2 in a planar view. In some embodiments, the second gates SGT1, SGT2 are disposed between the first gates FGT1, FGT2. In some embodiments, the second gates SGT1, SGT2 are parallel to the first gates FGT1, FGT2.

In some embodiments, the first gates FGT1, FGT2 and the second gates SGT1, SGT2 are formed by using polycrystalline silicon, a metal, and/or alloy, including, for example, titanium nitride, tantalum nitride, or aluminum nitride. Various materials and/or alloys to form the first gates FGT1, FGT2 and the second gates SGT1, SGT2 are within the contemplated scope of the present disclosure.

In some embodiments, the two active areas FN1, FN2, the first gates FGT1, FGT2, and the second gates SGT1, SGT2 define a plurality of regions. For illustration, the active areas FN1, FN2, the first gate FGT1, and the second gate SGT1 surround and define a first rectangular region. The active areas FN1, FN2, the second gates SGT1, SGT2 surround and define a second rectangular region.

In some embodiments, some of the conductors IT are separately disposed in the regions surrounded by the active areas FN1, FN2, the first gates FGT1, FGT2, and the second gates SGT1, SGT2. Explained in a different way, these conductors IT are disposed between the active areas FN1, FN2 and also between one of the first gates FGT1, FGT2 and one of the second gates SGT1, SGT2, or between the active areas FN1, FN2 and also between the second gates SGT1, SGT2. For illustration, the conductor IT1 is disposed in a region surrounded by the active areas FN1, FN2, the first gate FGT1, and the second gate SGT1. The conductor IT3 is disposed in a region surrounded by the active areas FN1, FN2 and the second gates SGT1, SGT2.

In some embodiments, each of the second gates SGT1, SGT2 includes an opening. The openings are located between the active areas FN1, FN2. In some embodiments, some of the conductors IT are separately disposed within the openings. For illustration, the conductor IT2 is disposed within the opening OPN of the second gate SGT1. For simplicity of illustration, only one opening OPN is depicted and labeled in FIG. 2A. Elements like the opening OPN labeled in FIG. 2A are also referred to as openings. Other openings similar to the opening OPN are within the contemplated scope of the present disclosure.

In some embodiments, some of the conductors IT are disposed on the active areas FN1, FN2. In such embodiments, the conductors IT disposed on the active areas FN1, FN2 are configured to electrically connect the active areas FN1, FN2 to another layer of the semiconductor device 200.

In some embodiments, the conductors IT including the conductors IT1-IT3 in FIG. 2A are formed in the metal layer including M0_OD as described above. For illustration, the conductors IT in FIG. 2A are disposed in parallel to and apart from each other, and have longitudinal edges in the y direction. In some embodiments, the conductors IT are disposed in parallel to the first gate FGT1, FGT2 and the second gates SGT1, SGT2.

In some embodiments, the semiconductor device 200 further includes cut lines BS. For illustration in FIG. 2A, the cut lines BS are disposed in parallel to and apart from each other, and are elongated in the x direction. In some embodiments, the cut lines BS are perpendicular to the first gate FGT1, FGT2 and the second gates SGT1, SGT2 in a planar view. In some embodiments, two of the cut lines BS are disposed at, and spaced apart from, two sides of the active area FN1, and the other two of the cut lines BS are disposed at, and spaced apart from, two sides of the active area FN2, as illustrated in FIG. 2A. In some embodiments, as illustrated in FIG. 2A, some of the cut lines BS are disposed between the conductors IT that are formed in, for illustration, the openings OPN as described above, and the conductors IT that are disposed on the active area FN1 or FN2.

Figure 2B:
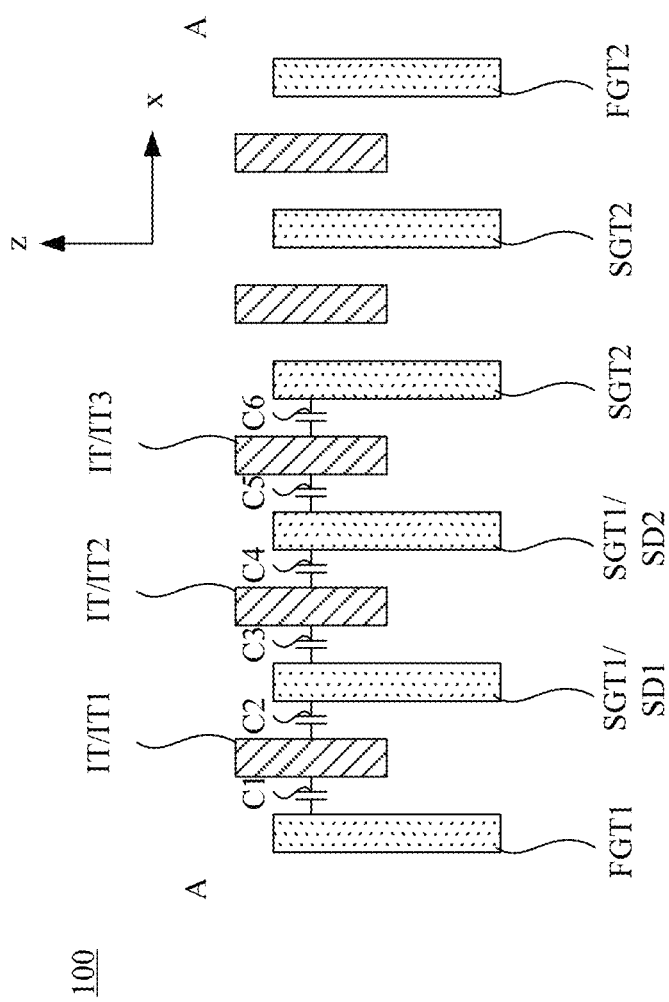
FIG. 2B is a schematic side view of components in the semiconductor device, taken along a line A-A, in FIG. 2A, in accordance with some embodiments of the present disclosure.

FIG. 2B is a schematic side view of the gates FGT1, FGT2, SGT1, and SGT2, and the conductors IT in the semiconductor device 200, taken along a line A-A, in FIG. 2A, in accordance with some embodiments of the present disclosure. In some embodiments, for illustration in FIG. 1B, the first gates FGT1, FGT2, the second gates SGT1, SGT2 and the conductors IT are at least partially overlapped in the z direction to form a plurality of capacitors. The connections and/or layer implementations of the gates FGT1, FGT2, SGT1, SGT2, and the conductors IT in FIG. 2B, are similar to those as illustrated in FIG. 1A and FIG. 1B. Therefore, details of connections and/or layer implementations of the gates FGT1, FGT2, SGT1, SGT2, and the conductors IT in FIG. 2B are not further detailed herein.

For illustration with reference to FIG. 2B, the first gate FGT1 and the conductor IT1 are partially overlapped in the z direction to form a first capacitor C1. The conductor IT1 and a first side SD1 of the second gate SGT1 are partially overlapped in the z direction to form a second capacitor C2. The conductor IT2 and two sides SD1, SD2 of the second gate SGT1 are partially overlapped in the z direction to respectively form a third capacitor C3 and a fourth capacitor C4. The conductor IT3 and a second side SD2 of the second gate SGT1 are partially overlapped in the z direction to form a fifth capacitor C5. The conductor IT3 and the second gate SGT2 are partially overlapped in the z direction to form a sixth capacitor C6.

In some embodiments, the capacitors C1-C6 are formed to be electrically connected in series. In some other embodiments, the capacitors C1-C6 are formed to be electrically connected in parallel. In alternative embodiments, the capacitors C1-C6 are formed to be electrically connected in series and parallel combination.

In some embodiments, the capacitors C1-C6 are electrically and physically connected in series. The first gates FGT1, FGT2 and the second gates SGT1, SGT2 are electrically connected with each other through the local conductive metal segment (e.g., M0PO) as discussed above or metal lines (not shown) in some embodiments. In some embodiments, the conductors IT are electrically connected with each other, for illustration, through metal lines (not shown). In such a configuration of the first gates FGT1, FGT2 and the second gates SGT1, SGT2 electrically connected with each other and the conductors IT electrically connected with each other, the capacitors C1-C6 are electrically connected in parallel.

In some embodiments, heights of the first gates FGT1, FGT2, the two opposite sides SD1, SD2 of the second gates SGT1, SGT2, and/or the conductors IT in the z direction correspond to capacitances of the capacitors C1-C6. In some embodiments, top portions of the conductors IT are higher than top portions of the first gates FGT1, FGT2, and the second gates SGT1, SGT2, as illustrated in FIG. 2B. In such embodiments, when the heights of the first gates FGT1, FGT2, and the two opposite sides of the second gates SGT1, SGT2 are increased with respect to the conductors IT toward +z direction (i.e., upward direction in FIG. 2B), the overlaps between the first gates FGT1, FGT2, the two opposite sides of the second gates SGT1, SGT2, and the conductors IT are increased accordingly. As a result, the capacitances of the capacitors C1-C6 are increased as well.

In alternative embodiments, when the heights of the conductors IT are increased with respect to the first gates FGT1, FGT2, and the two opposite sides of the second gates SGT1, SGT2 toward −z direction (i.e., downward direction in FIG. 2B), the overlaps between the first gates FGT1, FGT2, the two opposite sides of the second gates SGT1, SGT2, and the conductors IT are increased accordingly. As a result, the capacitances of the capacitors C1-C6 are increased as well.

In some embodiments, when one of the heights of the first gates FGT1, FGT2, and the two opposite sides of the second gates SGT1, SGT2, is increased with respect to an adjacent conductor IT toward +z direction, the area overlapping the adjacent conductor IT is increased. Accordingly, a capacitance of a corresponding capacitor is increased. In some embodiments, when one of the heights of the conductors IT is increased with respect to an adjacent first gate or second gate toward −z direction, a capacitance of a corresponding capacitor increases accordingly.

In some embodiments, the height of at least one of the first gates FGT1, FGT2, the second gates SGT1, SGT2, and the conductors IT, ranges between about 20-200. In some embodiments, the heights of the first gates FGT1, FGT2 and the second gates SGT1, SGT2 range between about 50 and about 70 nanometers, and the heights of the conductors IT range between about 40 and about 60 nanometers. The heights of the first gates FGT1, FGT2, the second gates SGT1, SGT2, and the conductors IT are given for illustrative purposes. Various heights of the first gates FGT1, FGT2, the second gates SGT1, SGT2, and the conductors IT in different manufacturing process are within the contemplated scope of the present disclosure.

For illustration, when both of the heights of the first gate FGT1 and the conductor IT1 are increased, the overlap between the first gate FGT1 and the conductor IT1 is increased, and the capacitance of the capacitor C1 is increased accordingly. Additionally, when the heights of two opposite sides SD1, SD2 of the second gate SGT2 and the adjacent conductors IT1, IT2, IT3 in the z direction are increased, the overlaps between the two opposite sides SD1, SD2 of the second gate SGT2 and the adjacent conductors IT1, IT2, IT3 are increased, and the capacitances of the capacitors C2-C5 are increased accordingly. Moreover, when both of the heights of the second gate SGT2 and the conductor IT3 are increased, the overlap between the second gate SGT2 and the conductor IT3 is increased, and the capacitance of the capacitor C6 is increased accordingly.

In some embodiments, each one of spacings between the first gates FGT1, FGT2, the second gates SGT1, SGT2, and the conductors IT, ranges between about 1 and about 150 nanometers. The spacings between the first gates FGT1, FGT2, the second gates SGT1, SGT2, and the conductors IT corresponds to capacitances of the capacitors discussed above. In some embodiments, the spacings between the first gates FGT1, FGT2, the second gates SGT1, SGT2, and the conductors IT, the capacitances of the capacitors C1-C6 therebetween increase accordingly.

For illustration, when the spacing between the first gate FGT1 and the conductor IT1 is decreased, the capacitance of the capacitor C1 is increased. When the spacing between the second gate SGT1 and the conductor IT1 is decreased, the capacitance of the capacitor C2 is increased. When the spacings between two sides SD1, SD2 of the second gate SGT1 and the conductor IT2 are decreased, the capacitances of the capacitors C3, C4 are increased. When the spacing between the second gate SGT1 and the conductor IT3 is decreased, the capacitance of the capacitor C5 is increased. When the spacing between the second gate SGT2 and the conductor IT3 is decreased, the capacitance of the capacitor C6 is increased.

In such a configuration, the semiconductor device 200 has a high capacitance density. In addition, the capacitances of the capacitors formed by the gates GT1-GT6 and the conductors IT would be increased in a manner along with the improvement of the manufacturing process.

Figure 3A:
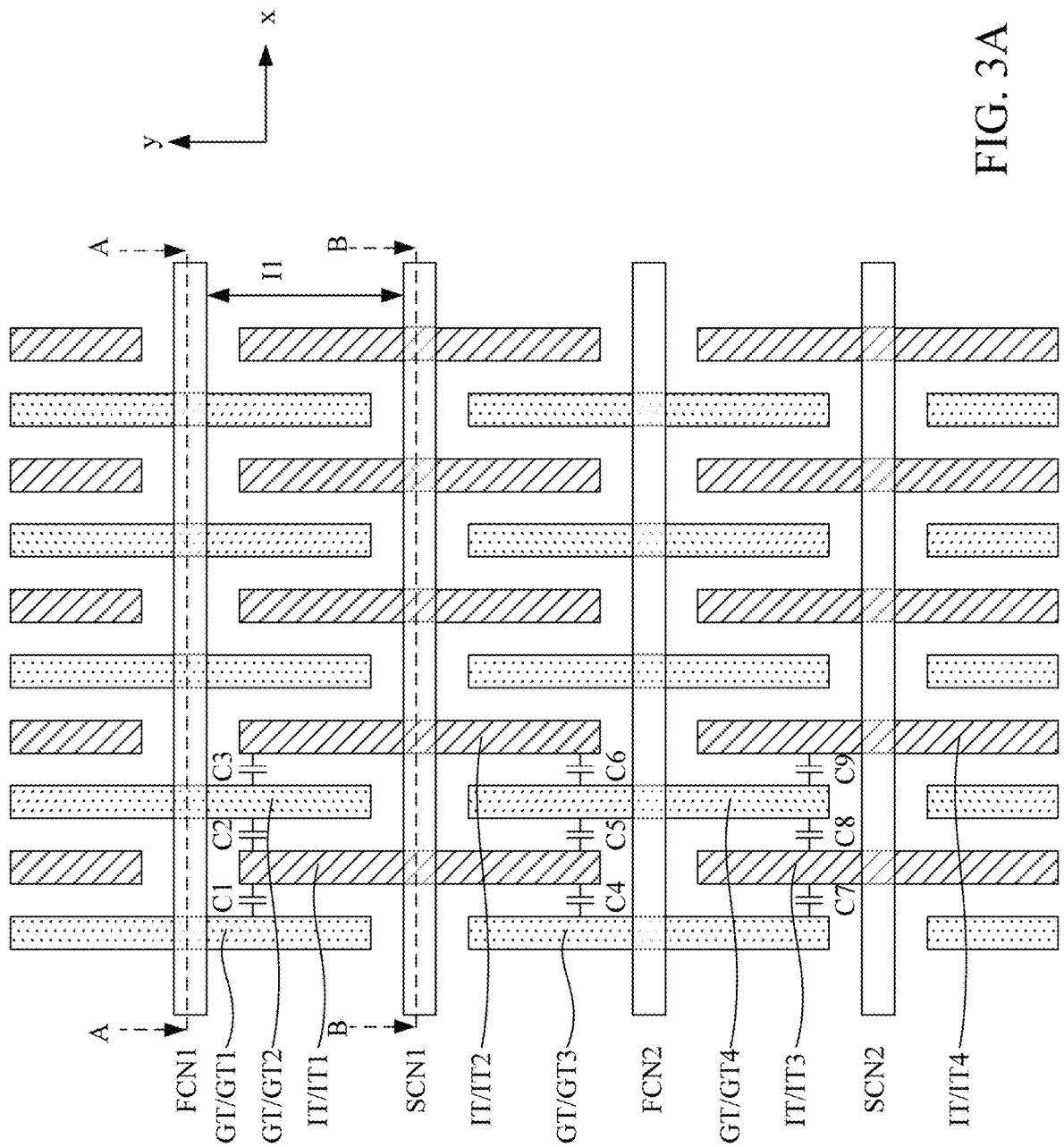
FIG. 3A is a top view of a schematic layout of a semiconductor device, in accordance with various embodiments of the present disclosure.
Figure 3B:
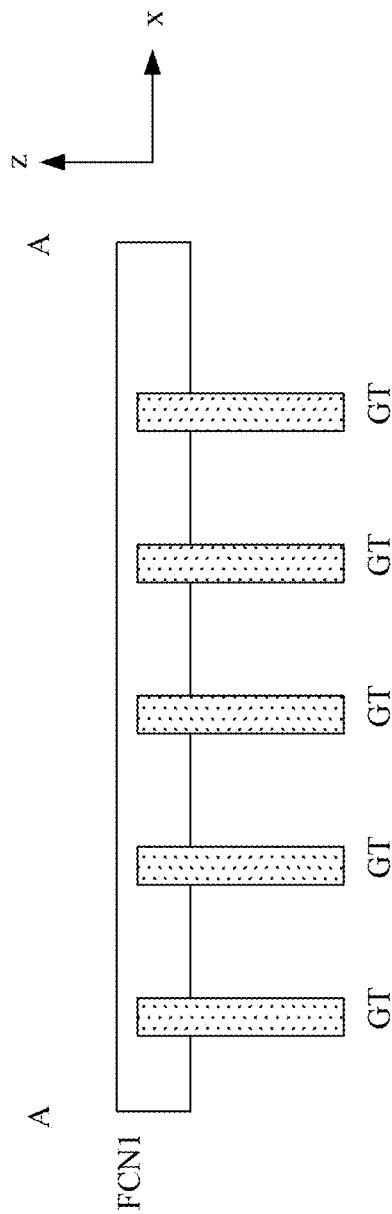
FIG. 3B is a schematic side view of components in the semiconductor device, taken along a line A-A, in FIG. 3A, in accordance with some embodiments of the present disclosure.
Figure 3C:
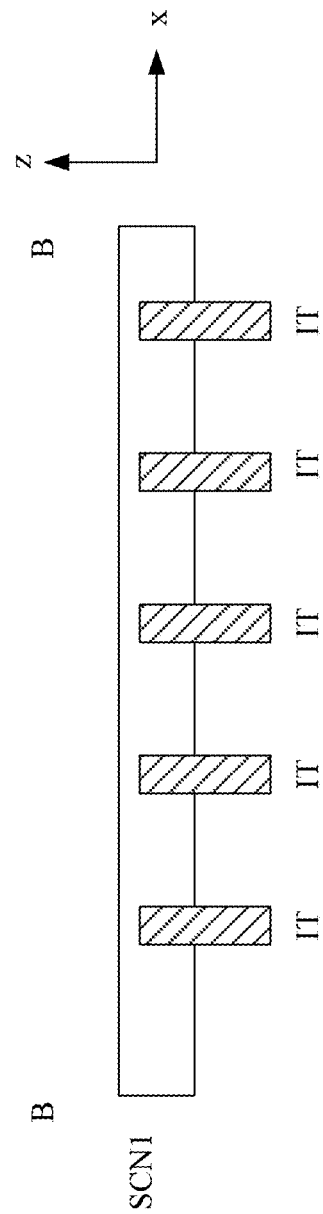
FIG. 3C is a schematic side view of components in the semiconductor device, taken along a line B-B, in FIG. 3A, in accordance with some embodiments of the present disclosure.

Reference is made to FIGS. 3A-3C. FIG. 3A is a top view of a schematic layout of a semiconductor device 300, in accordance with various embodiments of the present disclosure. With respect to the embodiments of FIG. 1A, like elements in FIG. 3A are designated with the same reference numbers for ease of understanding.

In some embodiments, the semiconductor device 300 includes a plurality of gate conductors GT, a plurality of interposing conductors IT, a plurality of first connectors FCN1, FCN2, and a plurality of second connectors SCN1, SCN2. For simplicity of illustration, only a few of gate conductors GT and interposing conductors IT are labeled in FIG. 3A. Elements like the gate conductors GT in FIG. 3A are also referred to as the gate conductors, and elements like the interposing conductors IT in FIG. 3A are also referred to as the interposing conductors.

The numbers of the gate conductors, the interposing conductors, the first connectors, and/or the second conductors shown in FIG. 3A are given for illustrative purposes. Various numbers of the gate conductors, the interposing conductors, the first connectors, and/or the second conductors are within the contemplated scope of the present disclosure.

FIG. 3B is a schematic side view of the first connector FCN1 and the gate conductors GT in the semiconductor device 300, taken along a line A-A, in FIG. 3A, in accordance with some embodiments of the present disclosure. FIG. 3C is a schematic side view of the second connector SCN1 and the interposing conductor IT in the semiconductor device 300, taken along a line B-B, in FIG. 3A, in accordance with some embodiments of the present disclosure. For ease of understanding, FIG. 3A is discussed below with reference to FIG. 3B and FIG. 3C.

In some embodiments, the gate conductors GT are arranged in a plurality of rows. In each of the rows, the gate conductors GT are in parallel to and apart from each other, and are elongated in the y direction. For illustration in FIG. 3A, the gate conductors GT1, GT2 are parallel to each other in the x direction and are elongated in the y direction, and the gate conductors GT3, GT4 are parallel to each other in the x direction and are elongated in the y direction. In some embodiments, the gate conductors GT are formed by using polycrystalline silicon, a metal, and/or alloy, including, for example, titanium nitride, tantalum nitride, or aluminum nitride. Various material and/or alloys to form the gates GT1-GT6 are within the contemplated scope of the present disclosure.

In some embodiments, the interposing conductors IT are arranged in a plurality of rows. In each of the rows, the interposing conductors IT are in parallel to and apart from each other, and are elongated in the y direction. For illustration in FIG. 3A, the interposing conductors IT1, IT2 are parallel to each other in the x direction and are elongated in the y direction, and the gate conductors IT3, IT4 are parallel to each other in the x direction and are elongated in the y direction. In some embodiments, the conductors IT are formed in a metal layer including M0_OD as discussed above. In some other embodiments, the conductors IT are formed by M0_OD as discussed above.

In some embodiments, the first connectors FCN1, FCN2 are each configured to electrically connect, for illustration, a row of the gate conductors GT. For illustration in FIG. 3A, the first connector FCN1 is configured to electrically connect the gate conductors GT1, GT2, and the first connector FCN2 is configured to electrically connect the gate conductors GT3, GT4. In some embodiments, the first connectors FCN1, FCN2 are formed in a metal layer including M0PO as discussed above. In some other embodiments, the first connectors FCN1, FCN2 are formed by M0PO as discussed above.

In some embodiments, the second connectors SCN1, SCN2 are each configured to electrically connect, for illustration, a row of the interposing conductors IT. For illustration in FIG. 3A, the second connector SCN1 is configured to electrically connect the interposing conductors IT1, IT2, and the second connector SCN2 is configured to electrically connect the interposing conductors IT3, IT4. In some embodiments, the second connectors SCN1, SCN2 are formed in a metal layer including M0PO as discussed above. In some other embodiments, the second connectors SCN1, SCN2 are formed by M0PO as discussed above.

In some embodiments, the gate conductors GT and the interposing conductors IT are partially interposed with each other. For illustration in FIG. 3A, the interposing conductor IT1 is partially interposed between the gate conductors GT1, GT2, and partially interposed between the gate conductors GT3, GT4. The gate conductor GT2 is partially interposed between the interposing conductors IT1, IT2. The gate conductor GT4 is partially interposed between the interposing conductors IT1, IT2, and partially interposed between the interposing conductors IT3, IT4.

As illustrated in FIG. 3A, the gate conductors GT and the interposing conductors IT are at least partially overlapped in the y direction to form capacitors. For illustration, the interposing conductor IT1 and the gate conductors GT1, GT2 are partially overlapped in the y direction to form capacitors C1, C2. The interposing conductor IT2 and the gate conductor GT2 are partially overlapped in the y direction to form a capacitor C3. The interposing conductor IT1 and the gate conductors GT3, GT4 are partially overlapped in the y direction to form capacitors C4, C5. The interposing conductor IT2 and the gate conductor GT4 are partially overlapped in the y direction to form a capacitor C6. The interposing conductor IT3 and the gate conductors GT3, GT4 are partially overlapped in the y direction to form capacitors C7, C8. The interposing conductor IT4 and the gate conductor GT4 are partially overlapped in the y direction to form a capacitor C9.

In some embodiments, the capacitors C1-C3 are electrically, and/or physically, connected in series, in parallel, or in series and parallel combination. In some embodiments, the capacitors C4-C6 are electrically, and/or physically, connected in series, in parallel, or in series and parallel combination. In some embodiments, the capacitors C7-C9 are electrically, and/or physically, connected in series, in parallel, or in series and parallel combination.

In some embodiments, the gate conductors GT1, GT2 are electrically connected with each other, and the interposing conductors IT1, IT2 are electrically connected with each other, as discussed above in FIG. 3A. In such a configuration, the capacitors C1-C3 are electrically connected in parallel. In some embodiments, the interposing conductors IT1, IT2 are electrically connected with each other, and the gate conductors GT3, GT4 are electrically connected with each other, as discussed above in FIG. 3A. In such a configuration, the capacitors C4-C6 are electrically connected in parallel. In some embodiments, the gate conductors GT3, GT4 are electrically connected with each other, and the interposing conductors IT3, IT4 are electrically connected with each other, as discussed above in FIG. 3A. In such a configuration, the capacitors C7-C9 are electrically connected in parallel.

In some embodiments, heights of the gate conductors GT1-GT4 and/or the interposing conductors IT1-IT4 correspond to capacitances of the capacitors C1-C9. In some embodiments, the heights of the gate conductors GT increase with respect to the interposing conductors IT, and/or the heights of the interposing conductors IT increase with respect to the gates GT. In such embodiments, the overlaps between the gate conductors GT and the interposing conductors IT are increased. Accordingly, the capacitances of the capacitors C1-C9 are increased.

In some embodiments, the height of at least one of the gate conductors GT and interposing conductors IT ranges between about 20 and about 200 nanometers. In various embodiments, the heights of the gate conductors GT range between about 50 and about 70 nanometers. In various embodiments, the heights of the interposing conductors IT range between about 40 and about 60 nanometers. The heights of the gates conductors GT and the interposing conductors IT are given for illustrative purposes. Various heights of the gate conductors GT and the interposing conductors IT in different manufacturing process are within the contemplated scope of the present disclosure.

In some embodiments, spacings between the gate conductors GT and the interposing conductors IT correspond to capacitances of the capacitors C1-C9. In some embodiments, the shorter the spacing between the gate conductor GT and the interposing conductor IT, the greater the capacitance of the capacitor formed therebetween.

In some embodiments, a spacing I1 between the first connector FCN1 and the second connector SCN1, as illustrated in FIG. 3A, is between about 115 nanometers and about 20 micrometers. Various values of the spacing I1 in various manufacturing processes are within the contemplated scope of the present disclosure. In some embodiments, the spacing I1 between the first connector FCN1 and the second connector SCN1 is defined by limitation of fabrication processes.

In some embodiments, the semiconductor device 300 is disposed between the active areas FN1, FN2 as illustrated in FIG. 1A. In some embodiments, the gate conductors GT are implemented by the gates GT1-GT6 in FIG. 1A, and the interposing conductors IT are implemented by the conductors IT between the active areas FN1, FN2 in FIG. 1A.

In some embodiments, a method disclosed includes the following operations as below: forming at least one capacitor between multiple interposing conductors and multiple gates; and forming multiple interposing connectors connected to the interposing conductors. One of the interposing conductors is interposed between two adjacent gates of the gates. In a plain view, the interposing connectors are separate from the gates.

In some embodiments, a device includes a first active area, a second active area, a first gate, a second gate, and a first conductor. The first active area and the second active area are separated from the first active area in a first direction. The first gate and the second gate are separated from the first gate in a second direction different from the first direction. At least one portion of the first gate and at least one portion of the second gate are arranged interposed between the first active area and the second active area. The first conductor extends in the first direction and is surrounded by the first active area, the second active area, the at least one portion of the first gate, and the at least one portion of the second gate to form at least one capacitor.

Also disclosed is a device that includes a first active area, a second active area, a first gate, and a first conductor. The first active area and the second active area extend in a first direction. The first gate crosses over the first active area and the second active area. The first gate includes an opening located between the first active area and the second active area. The first conductor is disposed within the opening of the first gate. The opening of the first gate, the first conductor, and the first gate extend in a second direction different from the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming at least one capacitor between a plurality of interposing conductors and a plurality of gates;
   forming a plurality of interposing connectors connected to the plurality of interposing conductors; and
   forming a plurality of gate connectors connected to the plurality of gates;
   wherein one of the plurality of interposing conductors is interposed between two adjacent gates of the plurality of gates;
   wherein in a plain view, the plurality of interposing connectors are separate from the plurality of gates;
   wherein in the plain view, the plurality of gate connectors cross over the plurality of gates.

2. The method of claim 1,
   wherein the plurality of gate connectors are interposed between the plurality of interposing connectors.

3. The method of claim 1,
   wherein in the plain view, the plurality of gate connectors are separate from the plurality of interposing conductors.

4. The method of claim 1, wherein the at least one capacitor comprises a plurality of capacitors;
   wherein forming the at least one capacitor comprises:
      forming the plurality of capacitors between one of the plurality of gates and two adjacent interposing conductors, of the plurality of interposing conductors, arranged at two opposite sides of the one of the plurality of gates.

5. The method of claim 1, wherein the at least one capacitor comprises a plurality of capacitors;
   wherein forming the at least one capacitor comprises:
      forming the plurality of capacitors between the one of the plurality of interposing conductors and the two adjacent gates, of the plurality of gates, arranged at two opposite sides of the one of the plurality of interposing conductors.

6. The method of claim 1, wherein the plurality of interposing conductors and the plurality of gates extend in a first direction, and the plurality of interposing connectors extend in a second direction different from the first direction.

7. The method of claim 1, wherein other two adjacent gates in the plurality of gates are separated from each other by a first region in a first direction, and
   one of the plurality of interposing connectors extends in a second direction to pass the first region.

8. The method of claim 7, wherein two adjacent interposing conductors in the plurality of interposing conductors are separated from each other by a second region in the first direction,
   wherein the method further comprises:
      forming a gate connector extending in the second direction to connect to the plurality of gates and to pass the second region.

9. The method of claim 8, wherein the first and second regions are arranged diagonally.

10. A method, comprising:
forming a plurality of capacitors between a plurality of interposing conductors and a plurality of gates that extend in a first direction; and
forming a first interposing connector that extends in a second direction and is connected to two adjacent interposing conductors in the plurality of interposing conductors and forming a first gate connector that extends in the second direction and is connected to first and second gates in the plurality of gates,
wherein the first interposing connector passes a first region defined by the two adjacent interposing conductors, the first gate and a third gate in the plurality of gates, the third gate being separate from the first gate in the first direction.

11. The method of claim 10, wherein the first gate connector passes a second region defined by the first and second gates, one of the two adjacent interposing conductors and another adjacent interposing conductor interposed between the first and second gates.

12. The method of claim 11, wherein the first and second regions are arranged diagonally.

13. The method of claim 10, further comprising:
forming a second interposing connector that extends in the second direction and are separated from the first interposing connector in the first direction,
wherein the first gate connector is interposed between the first and second interposing connectors.

14. The method of claim 13, further comprising:
forming a second gate connector that extends in the second direction and are separate from the first gate connector in the first direction,
wherein the first interposing connector is interposed between the first and second gate connectors.

15. A method, comprising:
forming a first group of capacitors between a first group of gates and a first group of interposing conductors;
forming a second group of capacitors between a second group of gates and a second group of interposing conductors; and
forming a first interposing connector that is connected to the first group of interposing conductors and interposed between the first and second groups of gates.

16. The method of claim 15, further comprising:
forming a third group of capacitors between the first group of interposing conductors and the second group of gates.

17. The method of claim 15, further comprising:
forming a second interposing connector connected to the second group of interposing conductors; and
forming a gate connector connected to the second group of gates,
wherein the gate connector is interposed between the first and second interposing connectors.

18. The method of claim 15, wherein a first portion of a conductor in the first group of interposing conductors extends from the first interposing connector in a first direction, and
a second portion of the conductor extends from the first interposing connector in a second direction different from the first direction,
wherein forming the first group of capacitors comprises:
forming at least two capacitors in the first group of capacitors between the first portion of the conductor and two gates in the first group of gates,
wherein the method further comprises:
forming a third group of capacitors between the second portion of the conductor and two gates in the second group of gates.

19. The method of claim 18, wherein the first interposing connector extends in a third direction different from the first and second directions.

20. The method of claim 15, wherein the first group of interposing conductors are interposed between the second group of gates.

* * * * *